United States Patent
Logie et al.

(10) Patent No.: US 6,841,447 B1
(45) Date of Patent: Jan. 11, 2005

(54) EEPROM DEVICE HAVING AN ISOLATION-BOUNDED TUNNEL CAPACITOR AND FABRICATION PROCESS

(75) Inventors: Stewart Logie, Campbell, CA (US); Sunil D. Mehta, Sunnyvale, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/232,912

(22) Filed: Aug. 30, 2002

(51) Int. Cl.[7] .......................................... H01L 21/8247
(52) U.S. Cl. ...................................... 438/264; 438/296
(58) Field of Search ................................ 438/257–267; 257/318

(56) References Cited

U.S. PATENT DOCUMENTS 4,924,278 A    5/1990  Logie
6,365,457 B1 * 4/2002  Choi .......................... 438/258
6,410,389 B1 * 6/2002  Cappelletti et al. ......... 438/257
6,613,631 B2 * 9/2003  Koishikawa ................ 438/258

* cited by examiner

Primary Examiner—Richard A. Booth
(74) Attorney, Agent, or Firm—Brinks Hofer Gilson & Lione (57) ABSTRACT

A semiconductor device having an EEPROM memory cell includes a substrate having a principal surface and an isolation region having an inner edge surface bounding the tunnel region at the principal surface. The isolation region forms a perimeter of the tunnel region. A capacitor plate overlies the tunnel region and substantially the entire perimeter of the tunnel region. A tunnel dielectric layer overlies the tunnel region and separates the capacitor plate from the tunnel dielectric layer. The edges of the capacitor plate are displaced away from the tunnel dielectric layer to avoid a loss of tunneling current as a result of edge degradation with repeated programming and erasing of the EEPROM memory device. A process for fabrication of the device is also provided.

19 Claims, 5 Drawing Sheets

EEPROM DEVICE HAVING AN ISOLATION-BOUNDED TUNNEL CAPACITOR AND FABRICATION PROCESS

TECHNICAL FIELD

The present invention relates, generally, to non-volatile memory devices and fabrication techniques and, more particularly, to single-poly EEPROM devices and methods for their fabrication.

BACKGROUND

Non-volatile memory devices are both electrically erasable and programmable. Such devices retain data even after the power to the device is terminated. One particular type of non-volatile memory device is the EEPROM device. In a flash EEPROM device, programming and erasing is accomplished by transferring electrons to and from a floating-gate electrode through a thin dielectric layer, known as a tunnel oxide layer, located between the floating-gate electrode and the underlying substrate. Typically, the electron transfer is carried out either by hot electron injection, or by Fowler-Nordheim tunneling. In either electron transfer mechanism, a voltage is coupled to the floating-gate electrode by a control-gate electrode, which can be a region in the substrate. The control-gate is capacitively coupled to the floating-gate electrode, such that a voltage applied to the control-gate electrode is coupled to the floating-gate electrode.

EEPROM cells are extensively used in programmable logic devices (PLDs). EEPROM cells used in PLDs can have a two-transistor design or a three-transistor design. A three transistor EEPROM cell, for example, includes a write transistor, a read transistor, and a sense transistor. In a two-transistor device, the functions of read and sense transistors are combined into a single transistor. To program PLD EEPROMs, a high voltage $V_{pp+}$ is applied to the gate electrode of the write transistor and a relatively low voltage $V_{pp}$ is applied to the drain (bit line contact) of the write transistor. The voltage applied to the write transistor gate electrode turns the write transistor on allowing the voltage applied to the bit line to be transferred to the source of the write transistor. Electrons on the floating-gate electrode are drawn from the floating-gate electrode to the source of the read transistor, leaving the floating-gate electrode at a high positive potential. The application of such high voltage levels is a write condition that results in a net positive charge being stored in the EEPROM cell.

To erase the EEPROM cell, a voltage $V_{cc}$ is applied to the gate of the write transistor and ground potential is applied to the bit line and a high voltage $V_{pp+}$ is applied to the array-control-gate. Under this bias condition, the high voltage applied to array-control-gate is coupled to the floating-gate electrode and the EEPROM cell is erased by the transfer of electrons from the substrate to the floating-gate electrode.

Efficient programming of the EEPROM cell requires a large capacitive coupling between the floating gate electrode and the array-control-gate. Improved capacitive coupling also allows programming and erasing to be carried out at reduced voltages. Additionally, during the read cycle, improved reading currents can be achieved.

The tunneling capacitor of an EEPROM memory cell is typically fabricated by defining a patterned layer of polysilicon overlying the tunnel oxide layer. The lateral extent of the capacitor is determined by the edge of a strip of polysilicon. Alternatively, a predefined tunnel oxide region overlying the substrate surface can determine the lateral extent of the capacitor. The tunnel oxide is typically fabricated by first etching an opening in a gate dielectric layer to expose a predetermined area of the substrate surface. Then, a thin layer of silicon dioxide is grown on the exposed portion of the substrate.

The processing methods used to fabricate a tunnel capacitor can affect the performance of the capacitor, which in turn, can affect the performance of the memory cell. For example, when the capacitor is defined by the edges of a patterned polysilicon layer, over time, with numerous program and erase cycles, the edges of the polysilicon slowly degrade. The edge degradation reduces the tunneling current, thus increasing the time needed to program and erase the memory cell. Further, the capacitor fabrication technique in which the capacitor edge is defined by etching a gate oxide layer and regrowing the tunnel oxide has become impractical in advanced memory devices. In advanced memory cells, the gate dielectric layer either has the same thickness as the tunnel oxide layer, or is even thinner than the tunnel oxide layer.

Accordingly, a need exists for an EEPROM device and fabrication process to produce an EEPROM device having an improved tunneling capacitor that is not susceptible to edge degradation and that does not require redundant processes techniques.

SUMMARY

The present invention provides a semiconductor device and, in particular, an EEPROM device in which a tunnel capacitor of the device is defined by an isolation region formed in a semiconductor substrate. The edge of the capacitor plate overlies the isolation region and covers the underlying substrate surface region bounded by the isolation region. A tunnel dielectric layer overlies the substrate surface region and separates the capacitor plate from the substrate. By fabricating the capacitor plate to overlap onto an isolation region bounding the tunnel dielectric layer, the long-term performance of the tunnel capacitor is improved. In particular, by eliminating the phenomenon of capacitor edge degradation, programming and erasing cycle time is maintained within design parameters over an extended period of time. Furthermore, by defining the charge transfer area of a tunnel capacitor with an isolation region redundant processing steps are avoided. For example, it is unnecessary to pattern and etch away a previously formed dielectric layer and regrow the tunnel dielectric layer.

In one aspect of the invention, a semiconductor device is provided that includes a substrate having a tunnel region extending to a principal surface of the substrate. The inner edge of an isolation region bounds the tunnel region at the principal surface and forms a perimeter of the tunnel region. A floating late layer overlies the tunnel region and substantially the entire perimeter of the tunnel region. A tunnel dielectric layer overlies the tunnel region and separates the floating gate layer from the tunnel region.

In another aspect of the invention, an EEPROM device includes a substrate having a principal surface and a tunnel region in the substrate. A tunnel dielectric layer overlies the tunnel region and an isolation region surrounds the tunnel region and forms a perimeter of the tunnel region at the principal surface. A charge exchange portion of a floating gate layer overlies the tunnel region and is separated from the tunnel region by the tunnel dielectric layer.

In yet another aspect of the invention, a process for fabricating a semiconductor device includes providing a semiconductor substrate having a principal surface and a well region in the semiconductor substrate. An isolation region is formed in the well region that encloses a tunnel region at the principal surface. The isolation region also forms a perimeter of the tunnel region. A floating gate layer having an edge surface is formed to overlie the tunnel region. The edge surface overlies the isolation region and is spaced away from the perimeter of the tunnel region.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

Figure 1:
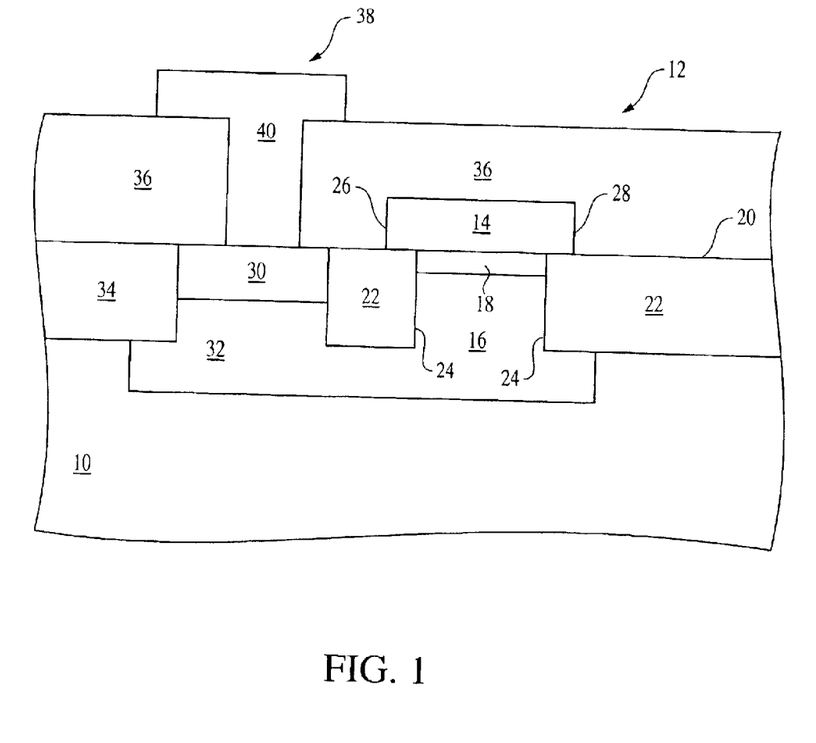
FIG. 1 illustrates, in cross-section, a portion of a semiconductor substrate that includes a tunnel capacitor arranged in accordance with the invention.

Shown in FIG. 1, in cross-section, is a portion of a semiconductor substrate 10 that includes a tunnel capacitor 12 arranged in accordance with one embodiment of the invention. Tunnel capacitor 12 includes a capacitor plate 14 separated from a tunnel region 16 by tunnel dielectric layer 18. Tunnel region 16 is defined at a principal surface 20 of semiconductor substrate 10 by an isolation region 22. An inner edge surface 24 of isolation region 22 bounds tunnel dielectric layer 18 at principal surface 20. First and second edges 26 and 28 of capacitor plate 14 overlie isolation region 22 and are spaced away from inner edge surface 24.

Tunnel capacitor 12 further includes a contact region 30 at principal surface 20. Contact region 30 is electrically coupled to tunnel region 16 by buried region 32 extending beneath a portion of isolation region 22. Contact region 30 is separated from tunnel dielectric layer 18 at principal surface 20 by a portion of isolation region 22. A second isolation region 34 resides at principal surface 20 and is spaced apart from isolation region 22 by contact region 30. An insulation layer 36 overlies principal surface 20 and covers capacitor plate 14. An electrically conductive material fills opening 38 and forms an electrical interconnect 40 that electrically couples tunnel region 16 to additional circuit elements (not shown).

Tunneling capacitor 12 can be integrated into a wide variety of semiconductor devices that store electrical charge in a floating gate layer. For example, tunneling capacitor 12 can be employed as the charge storage device in an EEPROM device or the memory component of an integrated circuit, such as a microcontroller device and the like.

Those skilled in the art will appreciate that the materials of construction can vary depending upon the particular type of device in which tunneling capacitor 12 is utilized. For example, semiconductor substrate 10 can be a silicon substrate, a silicon-on-oxide (SOI) substrate, an amorphous silicon substrate, an epitaxial silicon substrate, and the like. Further, the semiconductor substrate 10 can be doped to have an either an n-type or a p-type conductivity. In a preferred embodiment of the invention, semiconductor substrate 10 is a p-type silicon substrate and tunnel region 16 has an n-type conductivity. Also, preferably, contact region 30 is an n-type region with a doping concentration greater than that of tunnel region 16 or buried region 32. Capacitor plate 14 can be any of a number of different electrically conductive and semiconductive materials. For example, capacitor plate 14 can be polycrystalline silicon, amorphous silicon, and the like. Alternatively, capacitor plate 14 can be a refractory metal, a refractory metal silicide, and the like.

Isolation region 22 and second isolation region 34 are preferably trench isolation regions fabricated by first etching a recess or trench into semiconductor substrate 10 followed by depositing a layer of silicon oxide. After depositing the silicon oxide, a planarization process is carried out to form principal surface 20. Alternatively, other techniques, such as localized-oxidation-of-silicon (LOCOS) can be used. Further, tunnel dielectric layer 18 can be fabricated prior to or, preferably, after the formation of isolation region 22 and second isolation region 34. Preferably, tunnel dielectric layer 18 is formed by the thermal oxidation of semiconductor substrate 10 to form a layer of silicon oxide. As used herein, the term "silicon oxide" refers to all stoichiometric forms of silicon and oxygen, including silicon dioxide, and the like. In accordance with the invention, the thickness of tunnel dielectric layer 18 can vary from about 50 Å to about 100 Å.

Insulation layer 36 can be any of a number of different insulation materials, such as silicon oxide, formed by chemical-vapor-deposition (CVD). Where insulation layer 36 is formed by CVD, the CVD process can employ tetraethylorthosilane (TEOS) to form a later of silicon oxide. Further, insulation layer 36 can be phosphorus-silicate-glass (PSG), or boro-phosphorus-silicate-glass (BPSG), or the like. Also, interconnect 40 can be formed by a number of electrically conductive materials, such as aluminum, aluminum-silicon alloys, refractory metals, refractory metal sylicides, copper alloys, and the like. Additionally, other layers, such as diffusion barrier layers and the like (not shown) can also be formed to line the surface of opening 38 and overly contact region 30.

Figure 2:
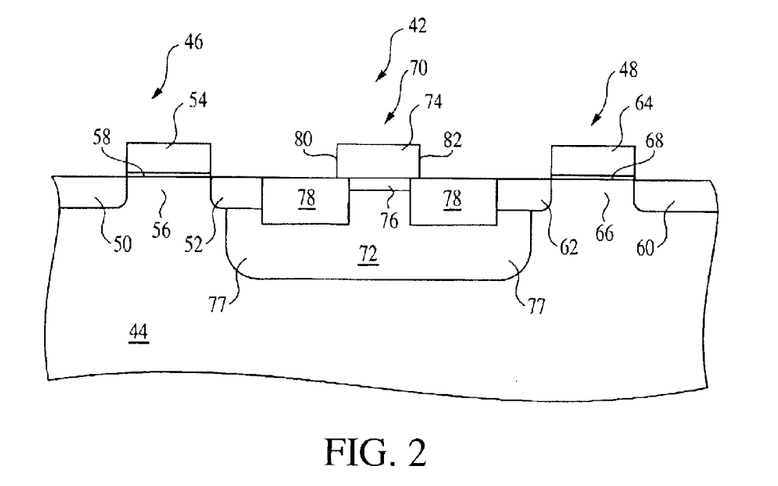
FIG. 2 illustrates, in cross-section, a portion of a 2-transistor EEPROM device arranged in accordance with the invention.

FIG. 2 illustrates, in cross-section, a 2-transistor EEPROM memory cell 42 fabricated in accordance with the invention. Memory cell 42 is fabricated in a semiconductor substrate 44 and includes two metal-oxide-semiconductor (MOS) transistors: a select transistor 46 and a sense transistor 48. Select transistor 46 includes a source region 50 and a drain region 52. A control gate electrode 54 overlies a channel region 56 and is separated therefrom by a gate dielectric layer 58. Sense transistor 48 includes a source region 60 and a drain region 62. A gate electrode 64 overlies a channel region 66 and is separated therefrom by a gate dielectric layer 68.

In accordance with the invention, a tunnel capacitor 70 is positioned intermediate to select transistor 46 and sense transistor 48. Tunnel capacitor 70 includes a tunnel region 72 in semiconductor substrate 44 and a capacitor plate 74 overlying a tunnel dielectric layer 76. Tunnel region 72 includes buried layer portions 77 electrically coupling tunnel region 72 with electrically elements of select transistor 46 and sense transistor 48. An isolation region 78 surrounds tunnel dielectric layer 76 and, in keeping with the capacitor plate edge exclusion advantage of the invention, edges 80 and 82 of capacitor plate 74 overlie isolation region 78.

Figure 3:
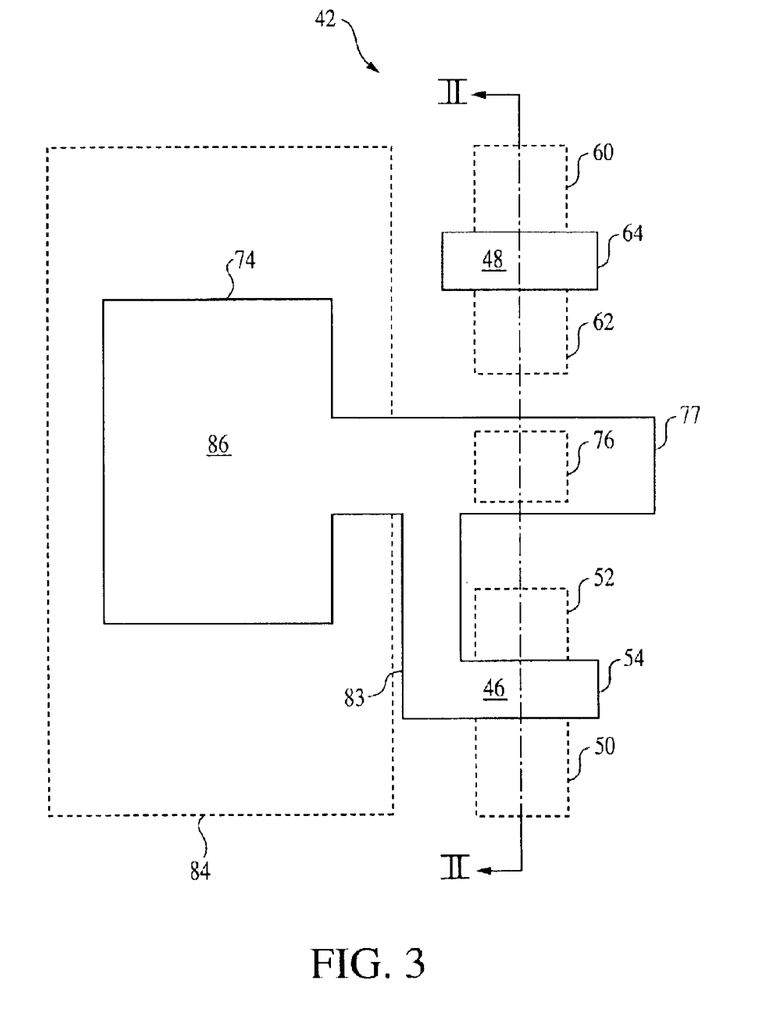
FIG. 3 is a top view of the 2-transistor EEPROM device illustrated in FIG. 2.

A top view of 2-transistor EEPROM memory cell 42 is illustrated in FIG. 3. Tunnel dielectric layer 76 is completely covered by capacitor plate 74, where tunnel dielectric layer 76 is shown by the silhouette line underlying a charge exchange portion 77 of capacitor plate 74. Gate electrode 54 of select transistor 46 is formed by a gate portion 83 of capacitor plate 74. Additionally, an array control gate 84 is formed in semiconductor substrate 44 and underlies a control capacitor portion 86 of capacitor plate 74. Those skilled in the art will appreciate that capacitor plate 74 functions as a floating gate layer in the 2-transistor EEPROM memory cell illustrated in FIGS. 2 and 3. Further, it will be appreciated that many different cell arrangements are possible that incorporate the functional elements of the 2-transistor memory cell. Accordingly, the arrangement illustrated in FIG. 3 is but one of many different possible arrangements for the functional components of a 2-transistor EEPROM memory cell of the present invention.

Figure 4:
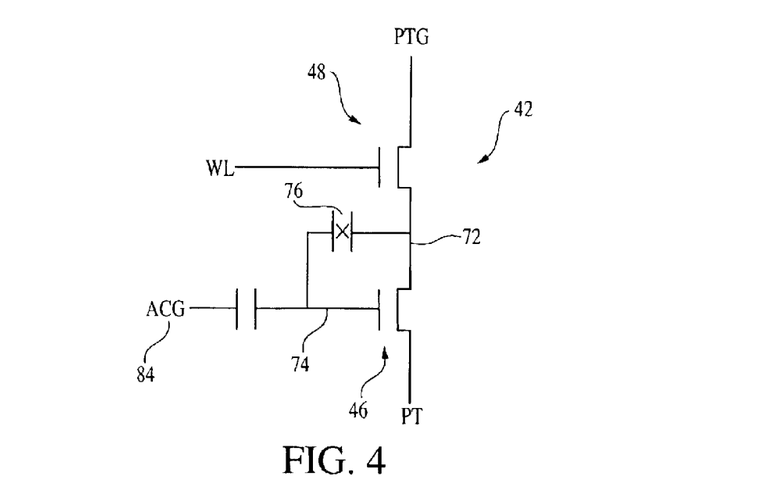
FIG. 4 is a schematic circuit diagram of a 2-transistor EEPROM device in accordance with the invention.

FIG. 4 illustrates a schematic circuit diagram of the 2-transistor EEPROM memory cell shown in FIGS. 2 and 3. As described above, capacitor plate 74 functions as a floating gate layer and is capacitively coupled to array control gate region 84 and to tunnel region 72 through tunnel dielectric layer 76. The EEPROM memory cell is coupled to a product term line (designated PT) through source region 50 of select transistor 46 and to a product term ground line (designated PTG) at source region 60 of sense transistor 48. A word line (designated WL) is coupled to gate electrode 64 of sense transistor 48.

Figure 5:
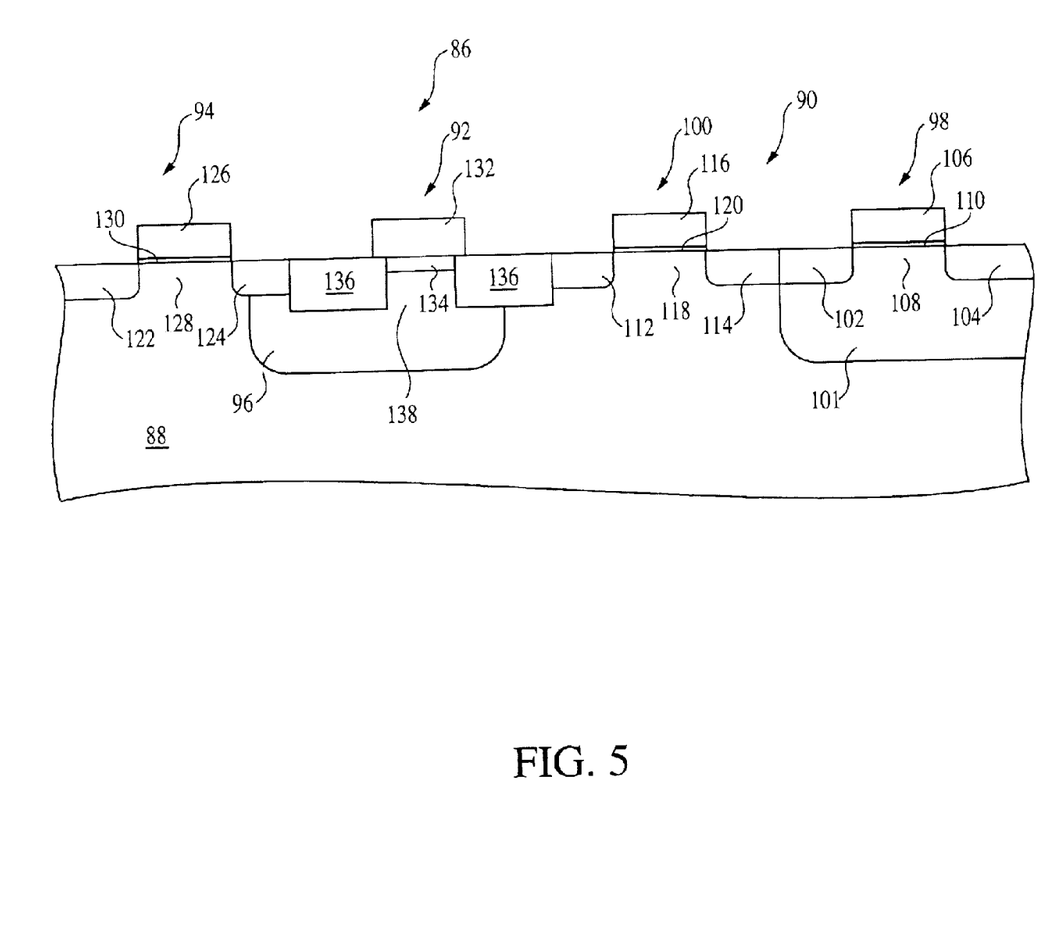
FIG. 5 illustrates, in cross-section, a portion of a 3-transistor EEPROM device arranged in accordance with the invention.

In another embodiment of the invention, a 3-transistor memory cell 86 is fabricated in a semiconductor substrate 88, as illustrated in FIG. 5. A tunnel capacitor 92 is coupled to a complementary-MOS (CMOS) inverter 90. In accordance with the invention, CMOS inverter 90 resides adjacent to a tunnel capacitor 92. Tunnel capacitor 92 is electrically coupled to a sense transistor 94 through a buried layer 96.

CMOS inverter 90 includes a PMOS transistor 98 and an NMOS transistor 100. In accordance with a preferred embodiment, semiconductor substrate 88 is a p-type substrate. Accordingly, an n-type region well region 101 is provide in which to fabricate PMOS transistor 98. Processing steps can be carried out in a conventional manner to form a well region 101 for PMOS transistor 98. PMOS transistor 98 includes a source region 102 and a drain region 104. A gate electrode 106 overlies a channel region 108 and is separated therefrom by gate dielectric layer 110. NMOS transistor 100 includes a source region 112 and a drain region 114. A gate electrode 116 overlies a channel region 118 and is separated therefrom by a gate dielectric layer 120.

Sense transistor 94 includes a source region 122 and a drain region 124. A gate electrode 126 overlies a channel region 128 and is separated therefrom by gate dielectric layer 130.

Tunnel capacitor 92 is electrically coupled to sense transistor 94 through drain region 124 and buried layer 96. Tunnel capacitor 92 includes a capacitor plate 132 overlying a tunnel dielectric layer 134 and portions of an isolation region 136. A tunnel region 138 underlies tunnel dielectric layer 134. As in the embodiments described above, capacitor plate 132 completely overlies dielectric layer 134 and isolation region 136 completely surrounds tunnel dielectric layer 134.

Figure 6:
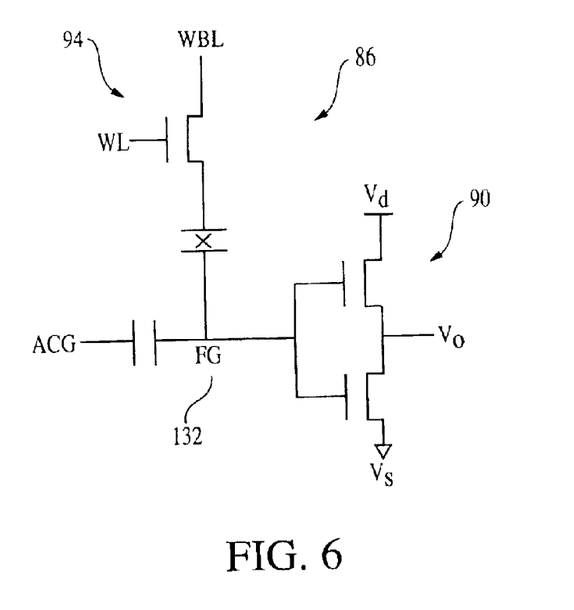
FIG. 6 is a schematic circuit diagram of a 3-transistor EEPROM device in accordance with the invention.

A schematic circuit diagram of 3-transistor EEPROM memory cell 86 is illustrated in FIG. 6. Capacitor plate 132 functions as a floating gate layer (designated FG) and is capacitively coupled to an array control gate (designated ACG) and, as described above, to source region 124 of sense transistor 94. For operation of CMOS inverter 90, supply voltages "$V_d$" and "$V_s$" are coupled to drain region 104 of PMOS transistor 98 and source region 112 of CMOS transistor 100. During a read operation, an output voltage "$V_o$" determines the presence or absence of stored charge on the floating gate electrode. Those skilled in the art will appreciate that numerous variations in the cell architecture variations of 3-transistor EEPROM memory cells are possible. For example, a 3-transistor cell can be fabricated with all N-type transistor components rather than a CMOS inverter. Further, it will be appreciated that the arrangement illustrated in FIGS. 5 and 6 is but one of many possible arrangements for the components of a 3-transistor EEPROM memory cell in accordance with the invention.

Thus, it is apparent that there has been described, in accordance with the invention, an EEPROM memory cell having an isolation-bounded tunnel capacitor and a process for fabricating the device. Although the invention has been described and illustrated with reference to illustrative embodiments thereof, it is not intended that the invention be limited to those illustrative embodiments. Those skilled in the art will recognize that variations and modifications can be made without departing from the spirit of the invention. For example, additional electrical insulation layers can be provided to bound the tunnel dielectric layer. Further, the various transistors of the disclosed memory cells can include lightly doped source and drain extension regions, and the like. It is therefore intended to include within the invention all such variations and modifications as fall within the scope of the appended claims and equivalents thereof.

What is claimed is:

1. A process for fabricating a semiconductor device comprising:

providing a semiconductor substrate having a principal surface and a well region in the semiconductor substrate;

forming an isolation region in the well region;

wherein the isolation region encloses a tunnel region at the principal surface and forms a perimeter of the tunnel region, and wherein a buried layer resides under at least a portion of the isolation region and provides electrical contact to the tunnel region; and forming a floating gate layer having an edge surface, wherein floating gate layer overlies the tunnel region, and wherein the edge surface overlies the isolation region and is spaced away from the perimeter of the tunnel region.

2. The process of claim 1, wherein forming an isolation region comprises:

forming a trench in the substrate; and filling the trench with an insulating material.

3. The process of claim 2, wherein forming a trench comprises:

defining a lithographic mask having an isolation pattern therein;

wherein the isolation pattern is configured to define tunnel regions in the semiconductor substrate;

forming a lithographic mask on semiconductor substrate; and etching the semiconductor substrate using the lithographic mask as an etching mask.

4. The process of claim 3, wherein etching the substrate comprises anisotropically etching the substrate.

5. A process for fabricating an EEPROM device comprising:
   providing a substrate having a principal surface;
   forming a tunnel region in the substrate;
   forming a tunnel dielectric layer overlying the tunnel region;
   forming an isolation region surrounding the tunnel region and forming a perimeter of the tunnel region at the principal surface; and
   wherein a buried layer resides under at least a portion of the isolation region and provides electrical contact to the tunnel region; and
   forming a floating gate layer having a charge exchange portion overlying the tunnel region and separated therefrom by the tunnel dielectric layer.

6. The process of claim 5, wherein forming a floating gate layer comprises forming a layer having an edge surface extending along the charge exchange portion, wherein the edge surface overlies the isolation region and is spaced away from the perimeter of the tunnel region.

7. The process of claim 5 further comprising:
   forming a contact region in the substrate that is spaced apart from the tunnel region by the isolation region;
   wherein the buried region that electrically couples the tunnel region to the contact region.

8. The process of claim 7, wherein forming a contact region comprises one of forming a source region or forming a drain region for a write transistor.

9. The process of claim 7, wherein forming a buried region comprises forming a well region.

10. The process of claim 5 further comprising forming a control gate region in the substrate separated from the tunnel region by the isolation region, and wherein forming a floating gate layer further comprises forming a capacitor portion overlying at least a portion of the control gate region.

11. The process of claim 10, wherein forming a control gate region comprises forming a source region of a sense transistor.

12. The process of claim 5, wherein forming an isolation region comprises forming a trench isolation region.

13. A process for fabricating a semiconductor device comprising
   providing a substrate having a principal surface;
   forming a tunnel region in the substrate; forming an isolation region having an inner edge surface bounding the tunnel region at the principal surface and forming a perimeter of the tunnel region; and
   wherein a buried layer resides under at least a portion of the isolation region and provides electrical contact to the tunnel region;
   forming a tunnel dielectric layer overlying the tunnel region; and
   forming a capacitor plate overlying tunnel dielectric layer and substantially the entire perimeter of the tunnel region.

14. The process of claim 13 further comprising:
   forming a contact region in the substrate and spaced apart from the tunnel region by the isolation region;
   wherein the buried region that electrically couples the tunnel region to the contact region.

15. The process of claim 14, wherein forming a contact region comprises one of forming a source region or forming a drain region for an MOS transistor.

16. The process of claim 14, wherein forming a buried region comprises forming a well region in the substrate.

17. The process of claim 16, wherein forming a well region comprises forming an N-well region.

18. The process of claim 14 further comprising forming a metal interconnect electrically contacting the contact region.

19. The process of claim 13, wherein forming a tunnel dielectric layer comprises forming a layer of silicon oxide.

* * * * *

UNITED STATES PATENT AND TRADEMARK OFFICE
CERTIFICATE OF CORRECTION

PATENT NO. : 6,841,447 B2
DATED : January 11, 2005
INVENTOR(S) : Stewart Logie et al.

It is certified that error appears in the above-identified patent and that said Letters Patent is hereby corrected as shown below:

Column 8,
Line 24, "wherein the buried region that electrically couples" should be -- wherein the buried region electrically couples --.

Signed and Sealed this

Seventeenth Day of May, 2005

JON W. DUDAS
*Director of the United States Patent and Trademark Office*